US010753976B2

(12) United States Patent
Finney et al.

(10) Patent No.: US 10,753,976 B2
(45) Date of Patent: Aug. 25, 2020

(54) DETECTION OF TRANSIENT HIGH TORQUE EVENTS ASSOCIATED WITH ROTATING MACHINERY IN ELECTRIC POWER SYSTEMS

(71) Applicant: Schweitzer Engineering Laboratories, Inc., Pullman, WA (US)

(72) Inventors: Dale S. Finney, Little Bras D'or (CA); Normann Fischer, Colfax, WA (US); Derrick Haas, Houston, TX (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/783,925

(22) Filed: Oct. 13, 2017

(65) Prior Publication Data

US 2019/0113575 A1    Apr. 18, 2019

(51) Int. Cl.
*G01R 31/34* (2020.01)
*H01H 47/00* (2006.01)
(Continued)

(52) U.S. Cl.
CPC .......... *G01R 31/34* (2013.01); *H01H 47/002* (2013.01); *H02P 9/102* (2013.01); *H02P 29/0241* (2016.02); *H02P 29/60* (2016.02)

(58) Field of Classification Search
CPC .. G06K 9/6263; H04B 17/309; H04B 17/318; H04L 1/0002; H04L 5/0064;
(Continued)

(56) References Cited

U.S. PATENT DOCUMENTS 5,504,687 A * 4/1996 Wolf ................. G06F 17/50
700/95
5,989,154 A * 11/1999 Christensen .......... B60W 10/06
477/111
(Continued)

OTHER PUBLICATIONS

David Bowen "Motor-Operated Valves: Estimating Torque and Motion", Technical Brief No. 12, 2005. Acentech RH Lyon Division, Cambridge, MA retrieved from: https://www.google.com/url?sa=t&rct=j&q=&esrc=s&source=web&cd=1&ved=2ahUKEwjyrY23hOboAhWTbc0KHfyxCvsQFjAAegQIARAB&url=http%3A%2F%2Fwww.lyoncorp.com%2Ftechbriefs%2F12_motor_operated_valves.pdf&usg=AOvVaw0lfl1Lush5vFa94CWz6S5n.

*Primary Examiner* — Vinh P Nguyen
(74) *Attorney, Agent, or Firm* — Jared L. Cherry; Bradley W. Schield (57) ABSTRACT

The present disclosure relates to systems and methods for detecting transient high-torque events associated with rotating machinery in an electric power system. In one embodiment, a relay may include an electrical parameters module that receives a representation of a voltage and a current at a terminal of rotating machinery in an electric power system. A torque calculation module may continuously determine a calculated torque value for the rotating machinery using the representation of the voltage and the current at the terminal of the rotating machinery and compare each calculated torque value to a threshold. An action module may generate an alarm when the calculated torque value exceeds the threshold. A log module may generate a log comprising a peak of the calculated torque value and a time at which the peak torque value occurs.

23 Claims, 5 Drawing Sheets

(51) Int. Cl.
*H02P 9/10* (2006.01)
*H02P 29/024* (2016.01)
*H02P 29/60* (2016.01)

(58) Field of Classification Search
CPC ... H04L 67/1097; H04L 67/12; H04L 12/403; B60L 50/51; B60L 53/14; B60L 2250/16; B60L 2260/32; B60L 3/0023; B60L 15/007; B60L 15/38; B60L 2220/14; B60L 2240/421; B60L 2240/423; B60L 15/025; B60L 15/2009; B60L 15/2045; B60L 2220/12; B60L 2220/46; B60L 2240/12; B60L 2240/429; B60L 2240/62; B60L 2250/10; B60L 7/14; B60L 7/26; B60W 10/08; B60W 10/30; B60W 10/10; B60W 2510/081; B60W 2510/105
See application file for complete search history.

(56) References Cited

U.S. PATENT DOCUMENTS

| | | | |
|---|---|---|---|
| 6,505,132 B1 | 1/2003 | Takaku | |
| 6,591,200 B1* | 7/2003 | Cohen | G01L 3/00 |
| | | | 702/38 |
| 6,672,415 B1* | 1/2004 | Tabata | B60K 6/365 |
| | | | 180/65.25 |
| 7,990,093 B2* | 8/2011 | Kezobo | B62D 5/0487 |
| | | | 318/432 |
| 8,232,756 B2* | 7/2012 | Yoshihara | B60K 6/48 |
| | | | 318/434 |
| 8,836,256 B2* | 9/2014 | Vilar | H02P 23/14 |
| | | | 180/65.1 |
| 9,041,402 B2* | 5/2015 | Lalonge | H02H 7/222 |
| | | | 200/564 |
| 2016/0238432 A1* | 8/2016 | Starinki | H02P 6/22 |

* cited by examiner

DETECTION OF TRANSIENT HIGH TORQUE EVENTS ASSOCIATED WITH ROTATING MACHINERY IN ELECTRIC POWER SYSTEMS

TECHNICAL FIELD

This disclosure relates to systems and methods for detecting transient high-torque events associated with rotating machinery in an electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electrical power systems may comprise rotating machinery, such as synchronous and induction motors and generators. Periodically, the rotating machinery may be connected to and disconnected from the electric power system. Such connections and disconnections may be referred to as switching events. The rotating machinery may experience a variable level of torque based on the physical and electrical parameters when the rotating machinery is connected to the electric power system. Further, where multiple pieces of rotating machinery are connected to a common electrical bus, a switching event associated with any of the pieces of rotating machinery may cause all of the other pieces of rotating machinery to experience electromagnetic torque.

A variety of conditions may impact the magnitude of the torque resulting from switching events. High-torque events may be caused by a variety of factors, such as a system fault, a poor bus transfer, a poor synchronizing event, a power system reclosing event, an operator error, or a malicious attack on the power system. Moreover, certain types of deliberate maloperation, such as a cyberattack, may cause high-torque events with the objective of damaging the rotating machinery. The currents and voltages that are produced during a switching event may fall below the threshold imposed for by conventional protection functions. For example, in one embodiment, the rotating machinery may comprise a motor with a maximum current value. A motor protection relay may be configured to trip if the current exceeds the maximum current value. Although a high-torque transient event caused by a switching event may not exceed the maximum current value, which may be enforced by the motor protection relay, such an event may nonetheless cause mechanical fatigue and/or damage to the motor. Mechanical fatigue may accumulate over time and may ultimately lead to failure of rotating machinery.

Systems and methods consistent with the present disclosure may monitor the electrical and physical parameters associated with rotating machinery to identify potentially high-torque transient events. Such systems and methods may implement various strategies to reduce the occurrence of high-torque transient events. In one embodiment, a calculated maximum torque resulting from a switching event may be determined. The calculated maximum torque may be compared to a threshold. If the calculated maximum torque exceeds the threshold, one or more actions may be implemented. Such actions may include warning an operator of the occurrence of the event, triggering an event report, logging the calculated maximum torque, and when possible, adjusting parameters to reduce the calculated maximum torque or preventing a switching event that may cause a high-torque transient event.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or other electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using IEDs that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

Figure 1:
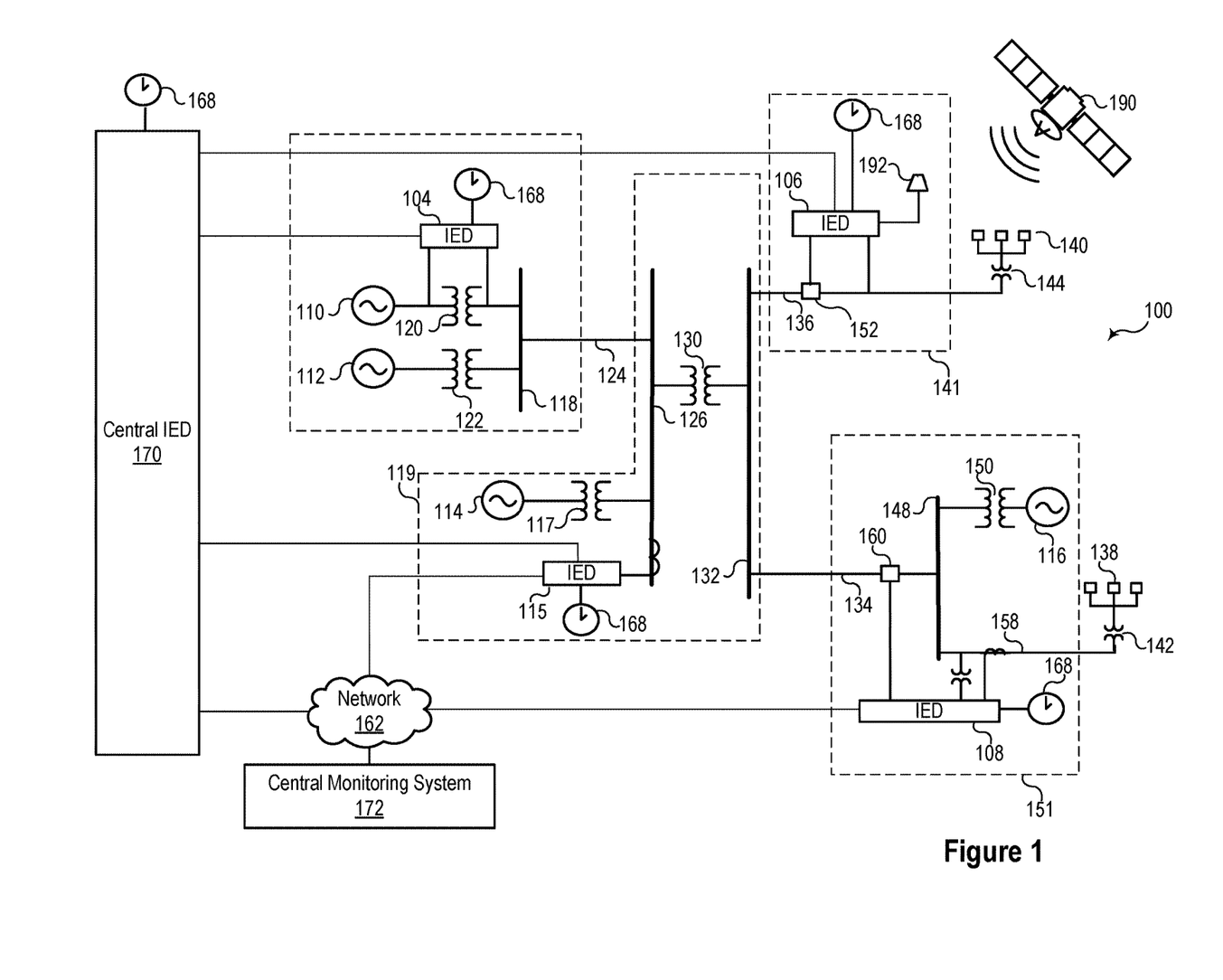
FIG. 1 illustrates a simplified one-line diagram of an electric power delivery system consistent with embodiments of the present disclosure.

FIG. 1 illustrates a simplified one-line diagram of an electric power transmission and distribution system 100 configured to utilize one or more secondary time sources to verify the accuracy of a primary time source consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138), and the like. A variety of other types of equipment may also be included in electric power delivery system 100, such as voltage regulators, capacitor banks, and the like.

Substation 119 may include a generator 114, which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further, step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162.

According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IED 104 may be configured to monitor parameters associated with generator 110. Such parameters may include monitoring currents, voltages, and/or other electrical conditions in system 100. Still further, IED 104 may be configured to monitor physical parameters associated with generator 110, such as rotational speed, angular position, etc. The electrical and/or mechanical parameters may be analyzed to synchronize generator 110 prior to connection of generator 110 to system 100. Such parameters may also be used to calculate a torque caused by connection of generator 110 to system 100. Still further, electrical parameters may be monitored to determine whether a switching event associated with one piece of rotating equipment causes a high-torque transient event for any other pieces of rotating equipment in system 100. For example, electrical parameters associated with generator 112 may be monitored during a switching event associated with generator 110 to determine if the switching event causes generator 112 to experience a high-torque transient event.

Network 162 may be used to transmit information among various components in system 100, including IEDs 108, 115, 170, and central monitoring system 172. Information relating to electrical and mechanical parameters associated with rotating machinery in system 100 may be transmitted using network 162. One or more of IEDs, 104, 106, 108, 115, and 170 may be configured to implement the systems and methods contained herein for one or more pieces of rotating machinery in system 100.

A common time signal 168 may be used to time-align measurements for comparison and/or to synchronize action across system 100. Utilizing a common or universal time source may ensure that IEDs have a synchronized time signal that can be used to generate time-synchronized data, such as synchrophasors. In various embodiments, the common time source may comprise a time signal from a global navigation satellite system ("GNSS") system 190. IED 106 may include a receiver 192 configured to receive the time signal from the GNSS system 190. In various embodiments, IED 106 may be configured to distribute the time signal to other components in system 100, such as IEDs 104, 108, 115, and 170.

Figure 2:
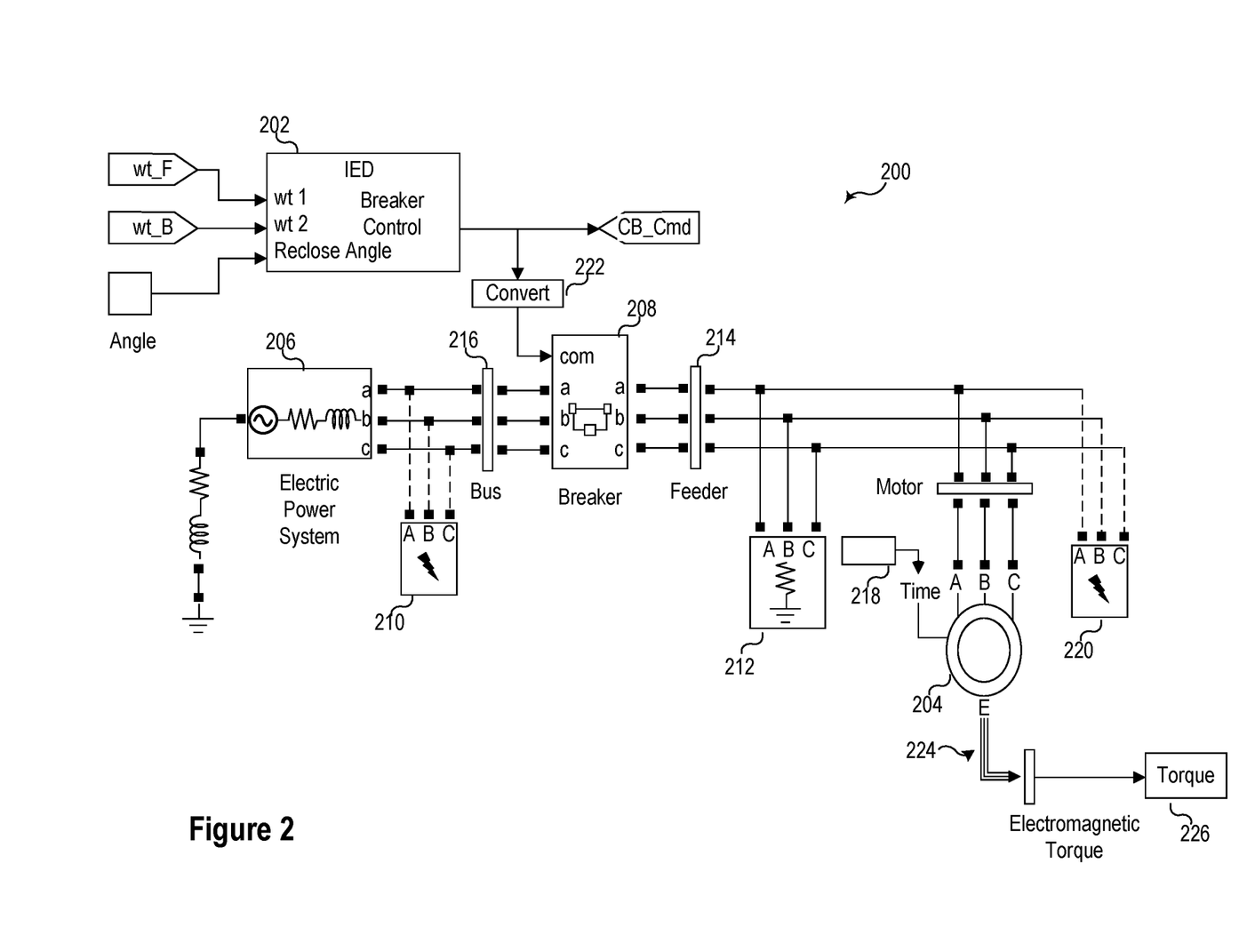
FIG. 2 illustrates a block diagram of a motor bus transfer model consistent with embodiments of the present disclosure.

FIG. 2 illustrates a block diagram of a motor bus transfer model 200 consistent with embodiments of the present disclosure. In the illustrated embodiment, an IED 202 may be configured to control connection of a motor 204 to an electric power system 206. IED 202 may control a breaker 208 that may be actuated to electrically connect and disconnect motor 204 and other elements to the electric power system 206. The breaker 208 may be disposed between an electrical bus 216 and a feeder 214.

IED 202 may be configured to monitor electrical conditions (e.g., voltage, current, frequency, etc.) associated with electrical power delivered by electric power system 206. IED 202 may receive signals from current and voltage transformers (not shown). Signal wt_F may represent the instantaneous voltage angle of the electrical electric power system, while signal wt_B may represent instantaneous voltage angle of the electrical machinery. An angle variable may be provided to IED 202. A reclose operation may be permitted if the phase angle is less than the angle variable. The IED may generate a breaker control output that controls the breaker 208. The output may also be associated with a signal CB_Cmd (i.e, a "close breaker" command) which may be transmitted to other systems that operate in conjunction with IED 202.

Breaker 208 may electrically connect a motor 204 and a load 212 to electric power system 206. Electrical faults 210 and 220 may occur on either side of breaker 208. The faults 210 and 220 are shown using dashed lines to illustrate that the faults are not permanent. The occurrence of an electrical fault may cause breaker 208 to actuate.

A convert module may be configured to convert a signal generated by IED 202 (e.g. a digital signal) to a signal operable to control breaker 208 (e.g., an analog signal). Motor 204 may convert electrical energy 224 to electromagnetic torque. The electromagnetic torque may generate mechanical torque 226 that may be used to perform work. A time input 218 may provide a time signal that may be used to time stamp various events.

Electrical torque generated by motor 204 may be calculated using the electrical parameters monitored by IED 202. In one embodiment, the terminal voltages and currents may be used to calculate the electrical torque for a synchronous motor using Eq. 1. In other embodiments, the calculation of electrical torque may be made using other equations and electrical parameters.

$$T_e = N_{pp}(I_{AB} \int (V_{CA} - r_s \cdot I_{CA}) - I_{CA} \int (V_{AB} - r_s \cdot I_{AB})) \qquad \text{Eq. 1}$$

Where,
$N_{pp}$ is the number of pole pairs of the rotating machinery,
$I_{AB}$ and $I_{CA}$, are the terminal currents of a motor,
$V_{AB}$ and $V_{CA}$ are the terminal voltages of the motor, and
$r_s$ is the stator resistance The calculation of Eq. 1 requires only one machine parameter, namely the stator resistance, $r_s$. For very large machines the stator resistance may be neglected. Otherwise the impact of stator resistance may be significant. Furthermore, the stator resistance may change with temperature. In some embodiments, an IED consistent with the present disclosure relays may include a thermal model that dynamically calculates the stator temperature rise using current measurements or a measurement of temperature to adjust the calculation of the stator resistance based on the temperature. In some embodiments, a temperature detector, such as a resistance temperature detectors (RTD) or thermocouple may provide measurements of the stator temperature. The resistance change, $\Delta R$, may be calculated using Eq. 2.

$$\Delta R = R_0 \cdot \alpha \cdot \Delta T \qquad \text{Eq. 2}$$

Where,
$R_0$ is the stator resistance at ambient temperature
$\alpha$ is the temperature coefficient of copper,
$\Delta T$ is the temperature rise calculated by the thermal model.

When calculating torque for a transient event, it is assumed in certain embodiments that that the event begins from a steady-state. An IED consistent with the present disclosure may be equipped with a disturbance detector that triggers from a change in an electrical system, such as a change in a current, a voltage, or a frequency. Still further, in some embodiments, the absence of a disturbance (i.e., a steady-state condition) may be used to dynamically "arm" or enable the torque calculation of Eq. 1. Disabling or disarming the torque calculation while the electric power system is not in a steady state may ensure an accurate calculation.

In the steady state, the integral terms (i.e., $\int (V_{CA} - r_s \cdot I_{CA})$ and $\int (V_{AB} - r_s \cdot I_{AB})$) may be assumed to be zero. If integration starts at an arbitrary instant in time an error will be introduced. One way to avoid an error is to start integrating at a peak of the instantaneous signal.

In various embodiments, an IED may be configured to calculate the electrical torque associated with rotating machinery using Eq. 1 and various electrical parameters. In some embodiments, the IED may continuously determine a calculated electrical torque value based on monitored electrical parameters. Each calculated torque value may be compared to a threshold. If the calculated torque value exceeds the threshold, one or more actions may be implemented. Such actions may include one or more of warning an operator of a switching event that caused the torque to exceed a threshold, triggering an event report, logging the maximum torque, blocking the switching event, adjusting parameters to reduce the calculated maximum torque, etc.

In some embodiments, calculations of the torque may be performed in real-time or near real-time, while in other embodiments, the calculation may be based on future or predicted electrical conditions. Still further, systems and methods consistent with the present disclosure may be configured to determine and to log peak torque values. The log of peak torque values may be utilized to track mechanical fatigue, provide maintenance recommendations, estimate the useful life of rotating machinery, and the like. In some embodiments, an oscillography trace associated with each event exceeding a threshold torque value may be stored for post-event analysis.

Figure 3:
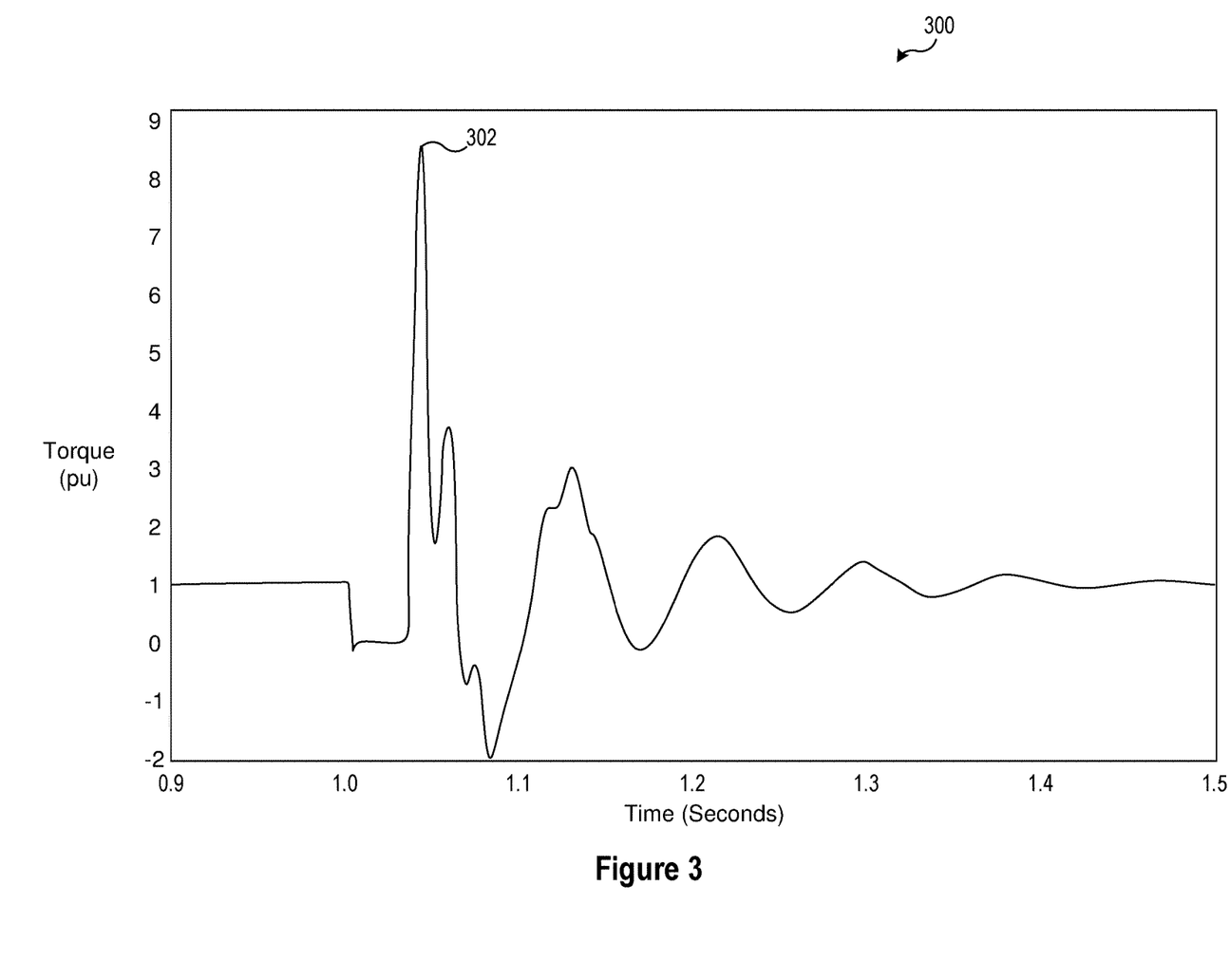
FIG. 3 illustrates a plot a torque value over a period of time in which a piece of rotating machinery is disconnected and re-connected to an electric power system consistent with embodiments of the present disclosure.

FIG. 3 illustrates a plot 300 of a torque value over a period of time in which a piece of rotating machinery is disconnected from and re-connected to an electric power system consistent with embodiments of the present disclosure. The torque value is shown in a per-unit scale. As such, the torque value in a steady-state condition is 1. At a time of 1 second, the rotating machinery is temporarily disconnected from an electric power system and the torque falls temporarily to 0 before the connection to the electrical power system is restored. The re-connection results in a significant spike in the torque. The peak 302 of the spike reaches a value of approximately 8.5 times the steady-state value. As the rotating machinery returns to steady-state operating conditions, the amplitude of the oscillations in the torque are dampened, and the torque value returns to the steady-state value. This increased torque may cause significant stress on components of the rotating machine. Such stress may cause mechanical fatigue, and over time, the mechanical fatigue may accumulate and cause components in the rotating machinery to fail. The useful life of rotating machinery and/or constituent components of rotating machinery may be extended by reducing the frequency and/or intensity of high-torque transient events.

In various embodiments, systems and methods consistent with the present disclosure may reduce the frequency and/or intensity of high-torque transient events using a variety of strategies. In some embodiments, conditions likely to create a high-torque transient event may be identified and certain types of actions (e.g., connection of rotating machinery) may be blocked. In some embodiments, a warning may be provided when an action may result in a high-torque transient event. In response to the warning, an operator may be prompted to provide confirmation before the action is performed.

Events that result in high-torque transient events may be logged, and such information may be used for a variety of purposes. For example, logs from a variety of devices may be compiled and analyzed to create a model describing how high-torque transient events affect equipment in an electric power system. Such models may allow for the creation of maintenance recommendations and/or predictions about the impact of high-torque transient events on the useful life of a piece of rotating machinery. Of course, the models may also account for a variety of factors in addition to high-torque transient events. Such information may also be useful to manufacturers of rotating machinery to identify points of failure and potential areas for improving the design of such equipment. Such logging may also be used in connection with post-event analysis.

Figure 4:
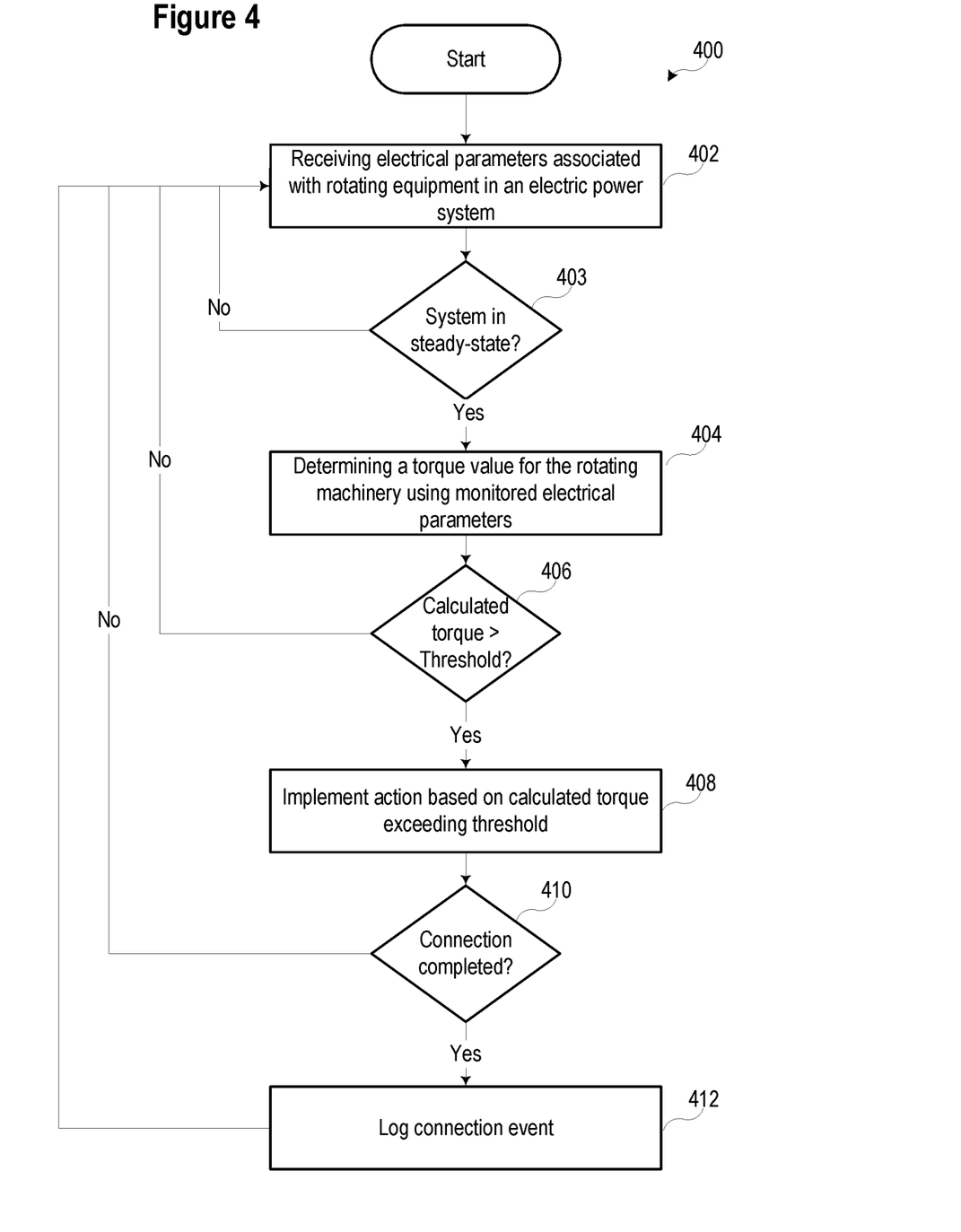
FIG. 4 illustrates a flow chart of a method for detecting transient high-torque events in an electric power system consistent with embodiments of the present disclosure.

FIG. 4 illustrates a flow chart of a method for detecting transient high-torque events in an electric power system consistent with embodiments of the present disclosure. At 402, electrical parameters associated with rotating machinery in an electric power system may be received. In one embodiment, the electrical parameters may comprise the terminal voltages and currents of rotating machinery. At 403, method 400 may determine whether the electric power system is in a steady state prior to arming or enabling the torque determination. Various methods may be used to identify if the system is in a steady state, including detection of a change the electrical parameters received at 402. In various embodiments, changes in one or more of a current, a voltage, or a frequency and provide an indication that the electric power system is not in a steady state, and as such, method 400 may return to 402 and wait until the electrical parameters are consistent with a steady-state condition.

At 404, a torque for the rotating machinery may be determined based on the monitored electrical parameters monitored at 402. In some embodiments where the rotating machinery comprises a synchronous motor, the torque may be calculated using Eq. 1. In other embodiments, the torque may be calculated using a variety of electrical parameters and techniques suitable for other types of rotating machinery (e.g., non-synchronous motors, generators, etc.).

At 406, method 400 may determine whether the calculated torque exceeds a threshold value. In some embodiments, the threshold value may comprise a default value or a user-specified value. In other embodiments, the threshold may be established by a manufacturer of the rotating machinery. In alternative embodiments, a plurality of thresholds may be provided. If the calculated torque is not greater than the threshold, the connection may proceed and method 400 may return to 402.

If the calculated torque is greater than the threshold, at 408, an action may be implemented. In various embodiments, the action may comprise one or more of blocking or delaying the connection until conditions improve, adjusting parameters to reduce the calculated maximum torque, warning an operator prior to completing the connection, etc. In some embodiments, the implemented action may be based on a plurality of thresholds. For example, in one embodiment, if the calculated torque is exceeds the threshold by a specified amount, the connection may be blocked, while if the calculated torque is less than the specified amount, method 400 may only provide a warning and seek operator approval before completing the connection.

At 410, method 400 may determine whether the connection was completed. If the connection was not completed, method 400 may return to 402. In some cases, an operator may respond to the action implemented at 408 (e.g. an alarm or a warning) by preventing the connection. If the connection is completed, the event may be logged at 412. In some embodiments, the logged information may comprise a peak torque value would a time stamp of the event. Other embodiments may include additional information in the log, such as oscillography trace associated with the connection event, At 412, information about the connection event may be logged. In various embodiments, the log may include additional information, such as an oscillography trace of the connection event, the monitored electrical parameters obtained at 402, and the like. The log of peak torque values may be utilized to track mechanical fatigue, provide maintenance recommendations, estimate the useful life of rotating machinery, and the like.

The logged information may be used in some embodiments to develop a model to predict the impact of transient high-torque events on rotating machinery. The model may provide an estimate of the effect of transient high-torque events over time based on recorded data. Still further, the logged information may be used to develop recommendations for maintenance or repairs that that may result from high-torque transient events. Such recommendations may extend the useful life of the rotating machinery and/or avoiding equipment failures.

Figure 5:
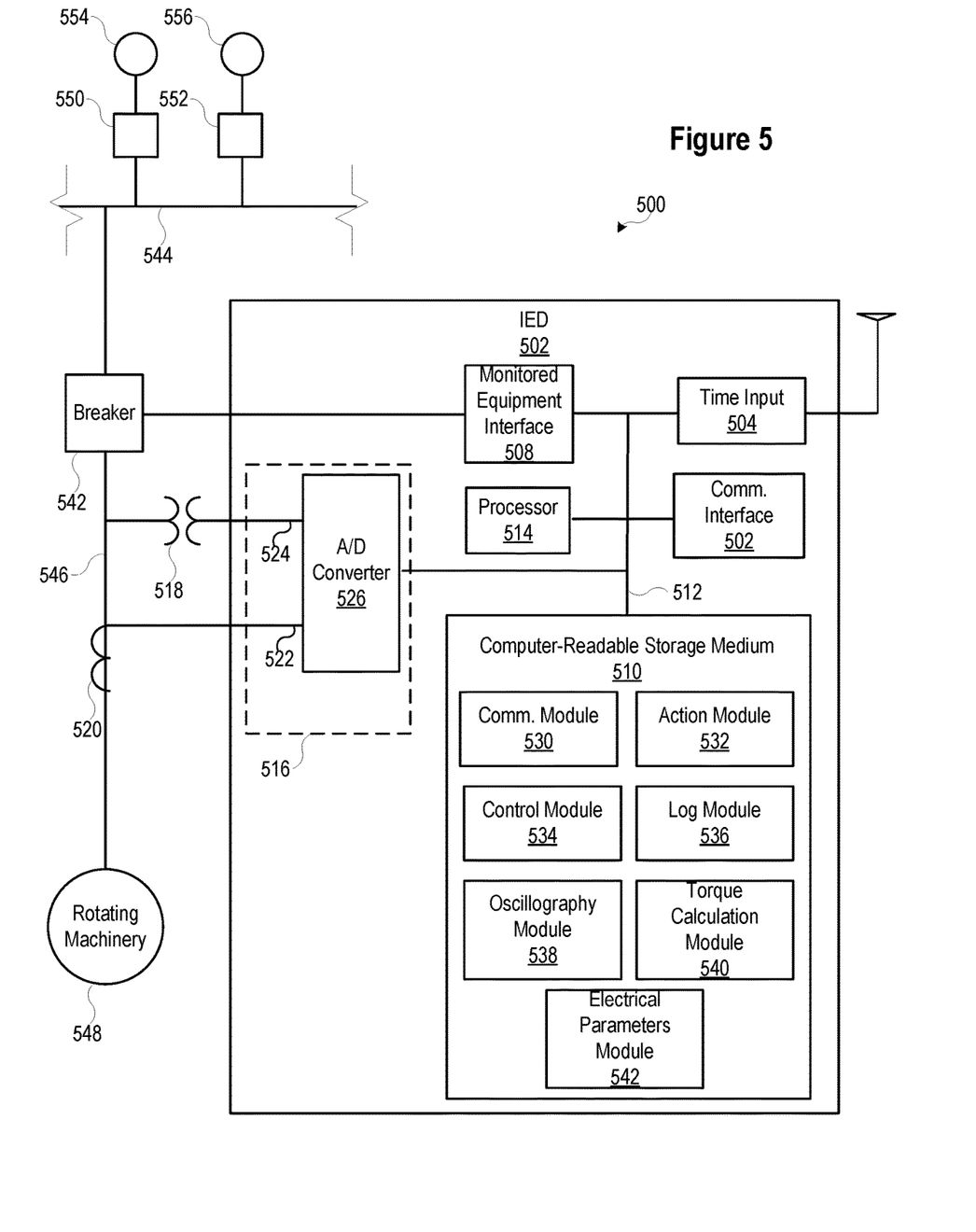
FIG. 5 illustrates a block diagram of a system comprising an intelligent electric device (IED) configured to detect transient high-torque events associated with rotating machinery consistent with embodiments of the present disclosure.

FIG. 5 illustrates a block diagram of a system 500 comprising an IED 502 configured to detect transient high-torque events associated with rotating machinery consistent with embodiments of the present disclosure. In various embodiment, IED 502 may comprise a motor relay, a generator relay, or other device configured to monitor and/or protect rotating machinery 548. Rotating machinery may be embodied as a generator, a synchronous motor, an asynchronous motor, or any other type of rotating machinery. Rotating machinery 548 may be selectively connected to a feeder 544 using breaker 542. Feeder 544 may be in electrical communication with an electric power system and rotating machinery may either draw power from or provide power to the electric power system via feeder 544.

Rotating machinery 554 and 556 may also be selectively connected to feeder 544 using breakers 550 and 552, respectively. A switching event associated with any of rotating equipment 548, 554, and 556 may create a high-torque transient event for the other pieces of rotating equipment.

IED 502 may include a communication interface 502 configured to communicate with a communication network. IED 502 may communicate with other IEDs or other devices or systems (e.g., a SCADA system, a wide-area situational awareness system, etc.). The communication interface 502 may be embodied as a network interface, optical interface, a serial interface, or a variety of other types of communication interfaces. IED 502 may also include a time input 504, which may be used to receive a time signal from a Navigation Satellite System (GNSS) or other system, such as the WWVB system. In certain embodiments, a common time reference may be received via network interface 502, and accordingly, a separate time input 504 and/or Global time input 506 may not be necessary. One such embodiment may employ the IEEE 1588 protocol.

A monitored equipment interface 508 may be configured to receive equipment status information from, and issue control instructions to a piece of monitored equipment, such as breaker 542. In some embodiments, the equipment status information and/or control instructions may be communicated over the communications interface 502.

A computer-readable storage medium 510 may be the repository of one or more modules and/or executable instructions configured to implement any of the processes described herein. A data bus 512 may link monitored equipment interface 508, time input 504, communication interface 502, and the computer-readable storage medium 510 to a processor 514.

Processor 514 may be configured to process communications received via communications interface 502, time input 504, and/or monitored equipment interface 508. Processor 514 may operate using any number of processing rates and architectures. Processor 514 may be configured to perform various algorithms and calculations described herein using computer executable instructions stored on computer-readable storage medium 510. Processor 514 may be embodied as a general purpose integrated circuit, an application specific integrated circuit, a field-programmable gate array, and/or other programmable logic devices.

In certain embodiments, IED 502 may include a sensor component 516. In the illustrated embodiment, sensor component 516 is configured to gather data from a conductor 546 using a voltage transformer 518 and a current transformer 520. Voltage transformer 518 may be configured to step-down the voltage (V) on conductor 546 to a magnitude that can be readily monitored and measured by IED 502. Similarly, current transformer 520 may be configured to proportionally step-down a current flowing through conductor 546 to a magnitude that can be readily monitored and measured by IED 502. Various other instruments may be used to obtain signals from electric power delivery systems including, for example, Rogowski coils, optical transformers, and the like.

An analog-to-digital converter 526 may sample and/or digitize the measured voltage and/or current signals to form corresponding digitized current and voltage signals. A/D converter 526 may be connected to processor 514 by way of a bus 512, through which digitized representations of current and voltage signals may be transmitted to processor 514. As described above, processor 514 may be used to apply equipment status, measurements, and derived values to an IED module. In some embodiments, a separate device may be used in place of a sensor component 516 for providing signals from the conductor 546 to the IED 502. In some embodiments, a separate device may be configured to obtain signals from the electric power delivery system (such as voltage and/or current signals), and create digitized representations of the signals (for example current and voltage signals), apply a time stamp, and/or supply such information to the IED 502. In certain embodiments, the information that has been described as received from sensor component 516 is instead received from communications interface 502.

A monitored equipment interface 508 may be configured to receive status information from, and issue control instructions to a piece of monitored equipment, such as breaker 542. According to some embodiments, control instructions may also be issued via communications interface 502. Control instructions issued via communications interface 502 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface.

Computer-readable storage medium 510 may be the repository of one or more modules and/or executable instructions configured to implement certain functions and/or methods described herein. For example, computer-readable storage medium 510 may include a communication module 530, an action module 532, a control module 534, a log module 536, and oscillography module 538, a torque calculation module 540 and an electrical parameters module 542. The modules and/or executable instructions configured to implement various functions described herein. In one specific embodiment, the modules comprised within computer-readable storage medium 510 may be configured to implement method 400, as illustrated in FIG. 4.

The communication module 530 may include instructions for facilitating communication of information from IED 502 to other controllers and/or other components in the electric power delivery system. The communication module 530 may include instructions on the formatting of communications according to a variety of communication protocols. In some embodiments, communication module 530 may be configured to communicate information about high-torque transient events created by log module 536 to other systems.

An action module 532 may be configured to implement one or more action in where a calculated torque value exceeds a threshold value. In various embodiments, actions implemented by action module 532 may include one or more of blocking the connection, adjusting parameters to reduce the calculated maximum torque, warning an operator prior to completing the connection, etc.

A control module 534 may be configured to control the operation of rotating machinery 548 and/or breaker 542. In various embodiments, control module 534 may be configured to adjust one or more parameters of rotating machinery 548 in preparation for electrical connection to feeder 544. For example, if rotating machinery 548 is a generator, the generator may be synchronized prior to being electrically connected to feeder 544.

Log module 536 may be configured to generate a log of high-torque transient events associated with rotating machinery 548. In some embodiments, log module 536 may be configured to log a peak torque value associated with each connection of rotating machinery 548 to feeder 544. Such information may be utilized to track mechanical fatigue, provide maintenance recommendations, estimate the useful life of rotating machinery 548, and the like.

Oscillography module 538 may be configured to generate an oscillography trace associated with high-torque transient events associated with rotating machinery 548. In some embodiments, the oscillography trace may be similar to plot 200 and illustrated in FIG. 2. In various embodiments, the oscillography trace may identify a maximum torque value and may provide other information about high-torque transient events.

Torque calculation module 540 may be configured to calculate the torque experience by rotating machinery 548 based on electrical conditions determined by sensor component 516. In various embodiments, torque calculation module 540 may be configured to calculation the calculated torque in real-time or near real-time, while in other embodiments, the calculation may be based on future or predicted electrical conditions. The calculated torque may be compared to one or more torque thresholds. If the calculated maximum torque exceeds one or more torque thresholds, one or more actions may be implemented by action module 532. Torque calculation module 540 may also be configured to calculate a resistance of a stator. In some embodiments, the resistance of the stator may be calculated using Eq. 2. In various embodiments, the temperature of the stator may be calculated based on electrical parameters (e.g., current flowing through the stator) or based on temperature sensors (e.g., an RTD or thermocouple) in the stator.

Electrical parameters module 542 may be configured to receive and monitor electrical parameters associated with rotating machinery 548. In the illustrated embodiment, the electrical parameters may be received from sensor component 516. In other embodiments, electrical parameters may be received via communication interface 502. The electrical parameters received by sensor component 516 may be analyzed by electrical parameters module to determine other parameters of interest. For example current measurements may be analyzed to determine a frequency or phase of the electrical energy for purposes of synchronizing rotating machinery 548.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A relay configured to monitor rotating machinery in an electric power system and to detect a transient high-torque event during a switching event, the relay comprising:
   an electrical parameters module configured to receive a representation of a voltage and a current at a terminal of rotating machinery in an electric power system;
   a torque calculation module configured to:
      continuously determine a calculated torque value for the rotating machinery using the representation of the voltage and the current at the terminal of the rotating machinery; and
      compare each calculated torque value to a threshold;
   an action module configured to generate an alarm when the calculated torque value exceeds the threshold; and
   a log module configured to generate a log comprising a peak of the calculated torque value and a time at which the peak torque value occurs; and
   oscillography module configured to generate, in the log, an oscillography trace of the calculated torque value for a period of time surrounding the alarm.

2. A system configured to detect a transient high-torque event associated with rotating machinery in an electric power system, the system comprising:
   an electrical parameters module configured to receive voltage measurements and current measurements associated with rotating machinery in an electric power system;
   a torque calculation module configured:
      to determine a calculated transient torque value for the rotating machinery using an integration of the voltage measurements and the current measurements; and
      to determine that the calculated transient torque value exceeds a threshold; and
   an action module configured to implement an action based on the calculated transient torque value exceeding the threshold.

3. The system of claim 2, wherein the torque calculation module is further configured to calculate a resistance of a stator based on an ambient resistance of the stator and a dynamic temperature of the stator.

4. The system of claim 3, wherein the temperature of the stator is calculated based on the current measurements.

5. The system of claim 2, wherein the electrical parameters module is further configured to detect that the electrical power system is in a steady state condition based on an absence of a change in current measurements and voltage measurements and to enable the torque calculation module based on detection of the steady state condition.

6. The system of claim 2, wherein the action comprises an alarm to alert an operator that that the calculated transient torque value exceeds the threshold prior to connection of the rotating machinery to the electric power system.

7. The system of claim 2, wherein the torque calculation module is further configured:
to update the calculated transient torque value at a plurality of times; and
to compare each of the updated calculated transient torque values to the threshold.

8. The system of claim 2, wherein the rotating machinery comprises a generator and the action comprises an adjustment of at least one physical parameter of the generator to reduce the calculated transient torque value prior to connection of the generator to the electric power system.

9. The system of claim 2, further comprising a log module configured to generate a log comprising a peak of the calculated transient torque value and a time at which the peak torque value occurs.

10. The system of claim 9, further comprising a time input configured to receive a common time signal and wherein the time at which the peak torque value occurs is based on the common time signal.

11. The system of claim 2, further comprising an oscillography module configured to generate an oscillography trace of the calculated transient torque value for a period of time prior to the calculated transient torque value exceeding the threshold and after the calculated transient torque value exceeding the threshold.

12. The system of claim 2, wherein the rotating machinery comprises a motor and the threshold corresponds to a startup current value, associated with mechanical fatigue of the motor due to the high-torque transient event, that is less than a maximum current value of the motor enforced by a motor protection relay of the electric power system.

13. The system of claim 2, wherein the voltage measurements and current measurements are measured at a terminal of the rotating machinery.

14. The system of claim 2, wherein the calculated transient torque value is calculated based at least in part on the equation:

$$T_e = N_{pp}(\int(V_{CA} - r_s \cdot I_{CA}) - I_{CA}\int(V_{AB} - r_s \cdot I_{AB}))$$

where $N_{pp}$ is the number of poles of the rotating machinery;
$V_{AB}$ and $V_{CA}$ are terminal voltages of the rotating machinery;
$I_{AB}$ and $I_{CA}$ are terminal currents of the rotating machinery; and
$r_S$ is the stator resistance of the rotating machinery;
wherein the voltage measurements comprise $V_{AB}$ and $V_{CA}$ and the current measurements comprise $I_{AB}$ and $I_{CA}$.

15. A method for detecting a transient high-torque event associated with rotating machinery in an electric power system, the method comprising:
receiving voltage measurements and current measurements associated with rotating machinery in an electric power system;
determining a calculated transient torque value for the rotating machinery, using an integration of the voltage measurements and the current measurements, while the rotating machinery is disconnected from the electric power system;
determining that the calculated transient torque value exceeds a threshold;
implementing an action based on the calculated transient torque value exceeding the threshold.

16. The method of claim 15, wherein the action comprises triggering an alarm to alert an operator that the calculated transient torque value exceeds the threshold prior to connecting the rotating machinery to the electric power system.

17. The method of claim 15, wherein determining the calculated transient torque value comprises updating the calculated transient torque value at a plurality of times and comparing each of the updated calculated transient torque values to the threshold.

18. The method of claim 15, wherein the rotating machinery comprises a generator and the action comprises adjusting at least one parameter of the generator to reduce the calculated transient torque value prior to connection of the generator to the electric power system.

19. The method of claim 15, further comprising:
generating a log comprising a peak of the calculated transient torque value and a time at which the peak torque value occurs.

20. The method of claim 19, further comprising receiving a common time signal and wherein the time at which the peak torque value occurs is based on the common time signal.

21. The method of claim 15, further comprising generating an oscillography trace reflecting the calculated torque value for a period of time prior to the calculated transient torque value exceeding the threshold and after the calculated transient torque value exceeding the threshold.

22. The method of claim 15, wherein the rotating machinery comprises a motor and the threshold corresponds to a startup current value, associated with mechanical fatigue of the motor due to the high-torque transient event, that is less than a maximum current value of the motor enforced by a motor protection relay of the electric power system.

23. The method of claim 15, wherein the voltage measurements and current measurements are measured at a terminal of the rotating machinery.

* * * * *